(12) United States Patent
Jacob et al.

(10) Patent No.: US 10,263,151 B2
(45) Date of Patent: Apr. 16, 2019

(54) LIGHT EMITTING DIODES

(71) Applicant: GLOBALFOUNDRIES INC., Grand Cayman (KY)

(72) Inventors: Ajey P. Jacob, Watervliet, NY (US); Srinivasa Banna, San Jose, CA (US); Deepak Nayak, Union City, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 34 days.

(21) Appl. No.: 15/680,977

(22) Filed: Aug. 18, 2017

(65) Prior Publication Data

US 2019/0058087 A1 Feb. 21, 2019

(51) Int. Cl.

| H01L 27/15 | (2006.01) |
|---|---|
| H01L 33/24 | (2010.01) |
| H01L 33/40 | (2010.01) |
| H01L 21/20 | (2006.01) |
| H01L 33/18 | (2010.01) |

(Continued)

(52) U.S. Cl.
CPC ............ *H01L 33/24* (2013.01); *H01L 27/153* (2013.01); *H01L 33/0025* (2013.01); *H01L 33/0075* (2013.01); *H01L 33/06* (2013.01); *H01L 33/12* (2013.01); *H01L 33/32* (2013.01); *H01L 33/36* (2013.01); *H01L 33/46* (2013.01);
(Continued)

(58) Field of Classification Search
CPC ........... H01L 31/02325; H01L 31/0203; H01L 27/14618; H01L 27/14623; H01L 27/14625; H01L 2924/0002; H01L 2924/00; H01L 31/0547; H01L 27/14632; H01L 27/14685; H01L 27/14687; G02B 13/0085; G02B 21/367; Y10T 428/24
See application file for complete search history.

(56) References Cited

U.S. PATENT DOCUMENTS

| 5,813,753 A | 9/1998 | Vriens et al. |
|---|---|---|
| 7,646,033 B2 | 1/2010 | Tran et al. |

(Continued)

OTHER PUBLICATIONS

You et al., "Light extraction enhanced white light-emitting diodes with multi-layered phosphor configuration", Optics Express, vol. 18, No. 5, Mar. 1, 2010, pp. 5055-5060.

(Continued)

*Primary Examiner* — Brian Turner
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to light emitting diodes and methods of manufacture. The method includes: forming fin structures with a doped core region, on a substrate material; forming a first color emitting region by cladding the doped core region of a first fin structure of the fin structures, while protecting the doped core regions of a second fin structure and a third fin structure of the fin structures; forming a second color emitting region by cladding the doped core region of the second fin structure, while protecting the doped core regions of the first fin structure and the third fin structure; and forming a third color emitting region by cladding the doped core region of the third fin structure, while protecting the doped core regions of the first fin structure and the second fin structure.

20 Claims, 7 Drawing Sheets

(51) Int. Cl.
  H01L 33/38    (2010.01)
  H01L 33/06    (2010.01)
  H01L 33/32    (2010.01)
  H01L 33/00    (2010.01)
  H01L 33/12    (2010.01)
  H01L 33/46    (2010.01)
  H01L 33/36    (2010.01)
  H01L 33/16    (2010.01)

(52) U.S. Cl.
  CPC ...... H01L 33/16 (2013.01); H01L 2933/0016 (2013.01); H01L 2933/0025 (2013.01)

(56) References Cited

U.S. PATENT DOCUMENTS

| | | | |
|---|---|---|---|
| 7,667,238 | B2 | 2/2010 | Erchak et al. |
| 8,163,581 | B1 | 4/2012 | Or-Bach et al. |
| 8,168,998 | B2 | 5/2012 | David et al. |
| 8,835,965 | B2 | 9/2014 | Zhang et al. |
| 2008/0149944 | A1* | 6/2008 | Samuelson ............ B82Y 10/00 257/88 |
| 2009/0278153 | A1 | 11/2009 | Cho |
| 2010/0081218 | A1 | 4/2010 | Hardin |
| 2010/0155749 | A1* | 6/2010 | Chen ..................... C09K 11/025 257/89 |
| 2011/0001151 | A1 | 1/2011 | Le Toquin |
| 2011/0210370 | A1* | 9/2011 | Kamamori .............. H01L 33/62 257/99 |
| 2011/0266560 | A1 | 11/2011 | Basin et al. |
| 2011/0300644 | A1 | 12/2011 | Akimoto et al. |
| 2013/0112944 | A1* | 5/2013 | Cha ........................ B82Y 20/00 257/13 |
| 2013/0175558 | A1 | 7/2013 | Orsley et al. |
| 2013/0240348 | A1 | 9/2013 | Mi et al. |
| 2013/0256689 | A1* | 10/2013 | Pougeoise ....... H01L 31/022408 257/76 |
| 2014/0284726 | A1* | 9/2014 | Lee ..................... H01L 27/0886 257/401 |
| 2016/0093665 | A1 | 3/2016 | Schubert et al. |
| 2017/0323925 | A1* | 11/2017 | Schneider, Jr. ....... H01L 27/156 |

OTHER PUBLICATIONS

Wang et al., "Modeling on phosphor sedimentation phenomenon during curing process of high power LED packaging", Journal of Solid State Lighting, 2014, pp. 1-9, <http://www.journalofsolidstatelighting.com/content/1/1/2>.

Yeh et al., "Vertical nonpolar growth templates for light emitting diodes formed with GaN nanosheets", Appl. Phys. Lett., 2012.

Wang et al., "Color-turnable, phosphor-free InGaN nanowire light-emitting diode arrays monolithically integrated on silicon", Optics Express, vol. 22, No. S7, Dec. 15, 2014, DOI:10.1364/OE.22.0A1768, pp. A1768-A1775.

Xie et al., "On the efficiency droop in InGaN multiple quantum well blue light emitting diodes and its reduction with p-doped quantum well barriers", Applied Physics Letters, vol. 93, 2008, pp. 121107-1-121107-2. <http://scholarscompass.vcu.edu/egre_pubs/89>.

Weyers, "Substrates for GaN Technology", Ferdinand-Braun Insitut., Oct. 2005, pp. 1-24.

Yang et al., "Enhancement in Light Extraction Efficiency of GaN-Based Light-Emitting Diodes Using Double Dielectric Surface Passivation", Optics and Photonics Journal, No. 2, 2012, pp. 185-192, <http://dx.doi.org/10.4236/ppj.2012.23028>.

Finson et al., "Transparent SiO2 Barrier Coatings: Conversion and Production Status", Society of Vacuum Coaters, No. 505/856-7188, 1994, pp. 139-143.

* cited by examiner

LIGHT EMITTING DIODES

FIELD OF THE INVENTION

The present disclosure generally relates to semiconductor structures and, more particularly, to light emitting diodes and methods of manufacture.

BACKGROUND

Light-emitting diodes (LEDs) are used in displays for many different types of devices. The LED displays can be made from finFET structures composed of different materials, including gallium-nitride-on-silicon (GaN-on-Si) or sapphire.

The manufacture of LEDs is a challenge. For example, GaN has both a lattice mismatch and a thermal mismatch with Si, which can cause stresses in the structure, e.g., warping and cracks in the Si wafer. Also, as the indium (In) concentration increases, the lattice mismatch between the GaN and Si also increases. Moreover, the solid solubility of In in GaN can be very low, which leads to a large amount of growth defects in the GaN.

SUMMARY

In an aspect of the disclosure, a method comprises: forming fin structures with a doped core region, on a substrate material; forming a first color emitting region by cladding the doped core region of a first fin structure of the fin structures, while protecting the doped core regions of a second fin structure and a third fin structure of the fin structures; forming a second color emitting region by cladding the doped core region of the second fin structure, while protecting the doped core regions of the first fin structure and the third fin structure; and forming a third color emitting region by cladding the doped core region of the third fin structure, while protecting the second fin structure and the first fin structure.

In an aspect of the disclosure, a method comprises: forming fin structures of substrate material; recessing the fin structures to form recessed fin structures; forming doped core regions on the recessed fin structures by depositing core material on the recessed fin structures; forming a hardmask over core regions which are not yet to be cladded, while leaving at least one core region exposed for cladding; forming alternating cladding layers on the at least one exposed core region; removing the hardmask; forming another hardmask over the alternating cladding layers and at least one additional core region which is not yet to be cladded, while leaving at least another core region exposed for cladding; and forming alternating cladding layers on the at least another exposed core region.

In an aspect of the disclosure, a method comprises: forming doped fin structures of a substrate material; forming a first color emitting region by cladding a first doped fin structure of the doped fin structures, while protecting remaining doped fin structures; forming a second color emitting region by cladding a second doped fin structure of the doped fin structures, while protecting the first doped fin structure and the remaining doped fin structures; and forming a third color emitting region by cladding a third doped fin structure of the doped fin structures, while protecting the first doped fin structure, the second doped fin structure and the remaining doped fin structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to light emitting diodes (LED) and methods of manufacture. The LEDs can comprise finFETs used in displays. These displays can be used in wearable devices, such as a head mount display for a virtual reality (VR)/augmented reality (AR), amongst other examples. In embodiments, the finFET structures are arranged to emit a plurality of colors. The arrangement can include varying percentages of indium (In) in the layers of the multiple quantum well regions. Particularly, the percentage of In is varied to achieve different bandgaps for different color LEDs. More specifically, different percentages of In results in different quantum well bandgaps, which emit different wavelengths of light, i.e., different colors.

In embodiments, the structures and methods described herein allow for finFET structures with the least amount of defects in a GaN core region. Also, additional advantages from the structures and methods described herein include: (i) the formation of GaN nanorods and nanosheets which produce zero dislocation, non-polar facets on which to grow LED active regions; (ii) creation of non-polar planes on conventional orientation substrates in order to access the advantages of non-polar orientations without the cost of expensive substrates; (iii) 3D active regions which reduce efficiency droop associated with high current operation; (iv) nanostructures grown on Si or other low cost substrates to further reduce the manufacturing costs; and (v) red-green-blue (RGB) growth of vertical multiple quantum wells (MQW) on a nanosheet.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
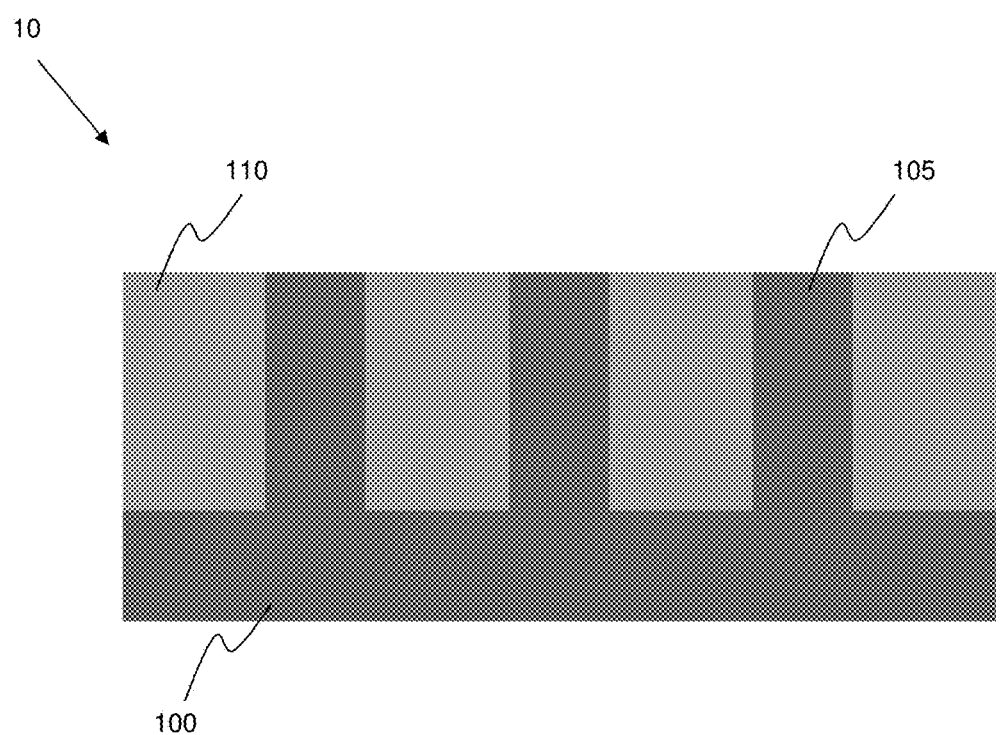
FIG. 1 shows an incoming fin structure, amongst other features, and respective fabrication processes in accordance with aspects of the present disclosure.

FIG. 1 shows a structure and respective fabrication processes in accordance with aspects of the present disclosure. In particular, FIG. 1 illustrates a finFET structure 10 comprising a substrate 100 which begins as a nanosheet for a light emitting diode (LED). In embodiments, the substrate 100 can be any appropriate semiconductor material, e.g., bulk Si, SiGe, SiGeC, SiC, 6H-SiC, GaAs, GaN, GaP, InAs, InN, InP, AlN, AlAs, $LiAlO_2$, sapphire and other III/V or II/VI compound semiconductors. The substrate 100 can be heavily doped by implantation processes or in-situ doping techniques, such as by an n-type doping.

Fin structures 105 are formed from the substrate 100, which can be doped individually, or already doped from the substrate 100. The fin structures 105 can be formed by etching the substrate 100 using conventional patterning processes, e.g., conventional sidewall image transfer (SIT) processes or CMOS lithography and etching processes, depending on the final width of the fin structures 105. For example, the fin structures 105 can have dimensions in a range of about 100 nm to 200 nm and more preferably about 10 nm to 50 nm, amongst other examples.

In the SIT technique, as an example, a mandrel is formed on the substrate 100 using conventional deposition processes, e.g., CVD. The mandrel material is different than the substrate 100, e.g., $SiO_2$. A resist is formed on the mandrel material, and exposed to light to form a pattern (openings). A RIE is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 105, for example. The mandrels are removed or stripped using a conventional etching process, selective to the mandrel material. An etching is then performed within the spacing of the spacers to form the sub-lithographic features. The sidewall spacers can then be stripped.

Isolation regions 110 are formed between the fin structures 105. In embodiments, the isolation regions 110 can be an oxide material, such as $SiO_2$, deposited between the fin structures 105. In embodiments, the isolation regions 110 are comprised of a material different than a later formed insulator layer which will cover portions of the isolation regions 110. The isolation regions 110 can be deposited to a height of the fin structures 105 using conventional deposition processes, e.g., chemical vapor deposition (CVD) processes. In alternate embodiments, the material of the isolation regions 110 can be deposited to a height above the fin structures 105, followed by a polishing process, e.g., a chemical mechanical polish (CMP), to a height of the fin structures 105.

Figure 2A:
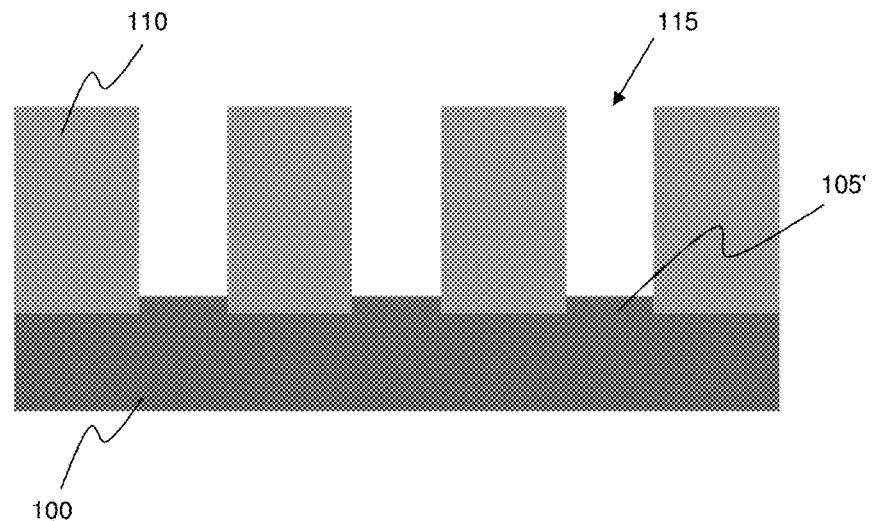
FIG. 2A shows recessed fin structures, amongst other features, and respective fabrication processes in accordance with aspects of the present disclosure.
Figure 2B:
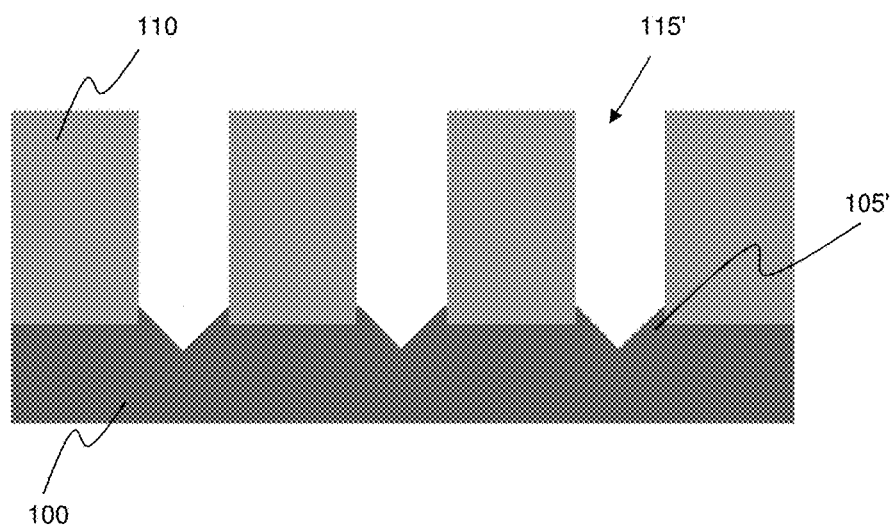
FIG. 2B shows etched fin structures in the [111] plane, amongst other features, and respective fabrication processes in accordance with aspects of the present disclosure.

FIGS. 2A and 2B show additional structures in accordance with aspects of the present disclosure. In FIG. 2A, the fin structures 105 are recessed, i.e., the substrate 100 is etched, as represented by reference numeral 105', to form recessed fin structures 105' and a recess 115 between the isolation regions 110. FIG. 2B shows the substrate 100, e.g., recessed fin structures 105', in a (111) plane to form the recesses 115' between the isolation regions 110. In FIGS. 2A and 2B, the recessed fin structures 105' are not completely removed, leaving a portion of the recessed fin structures 105' above the substrate 100 for subsequent processes. The recesses 115, 115' can be formed using conventional selective etching processes, e.g., RIE process.

Figure 3:
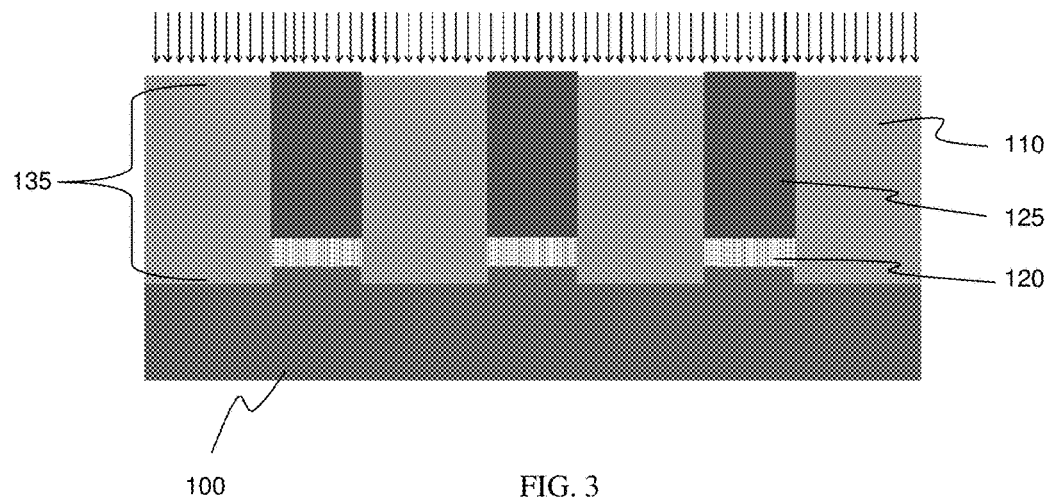
FIG. 3 shows multiple quantum well (MQW) regions, amongst other features, and respective fabrication processes in accordance with aspects of the present disclosure.

FIG. 3 shows replacement fin structures 135, i.e., part of the multiple quantum well (MQW) regions, grown within the recesses 115, 115', over the exposed recessed fin structures 105'. Specifically, the replacement fin structures 135 include a buffer layer 120 and a core region 125 formed over the buffer layer 120. Therefore, the buffer layer 120 can be formed between the core region 125 of each replacement fin structure 135 and the substrate material 100, which is etched to form the recessed fin structures 105'. In embodiments, the buffer layer 120 can be, e.g., AN, which can also be used as the material for the substrate 100. The buffer layer 120 can be deposited by a conventional deposition method, e.g., CVD processes, to a thickness of about 10 to 100 nanometers; although other dimensions are also contemplated herein. In further embodiments, the thickness of the buffer layer 120 can be in a range of about $\frac{1}{5}$ to $\frac{1}{10}$ of the thickness of the substrate 100, which can have a thickness of about 300 nm, for example.

Following the deposition of the buffer layer 120, the core region 125 is selectively grown thereon by depositing a core material on the recessed the fin structures. The core material of the core region 125 can be gallium nitride (GaN), which is used in light-emitting diodes. As should be understood by those of skill in the art, GaN has a wide band gap of 3.4 eV, which affords it special properties for applications in optoelectronic, high-power and high-frequency devices.

As further shown in FIG. 3, the core region 125 can be grown to a height of the isolation regions 110, i.e., planar with the isolation regions 110. Further, if the core region 125 is overgrown, i.e., higher than the isolation region 110, the core region 125 can be polished back to the surface of the isolation region 110 by a CMP process. In embodiments, the deposition of the buffer layer 120 and the core region 125 can occur on the (111) plane to form replacement fins.

More specifically, the Si of the substrate 100 will have either a (111) or (110) plane for the GaN growth, i.e., the core region 125. This is because the Si (100) plane has more defects than either the (111) plane or (110) plane. In embodiments, the buffer layer 120 and the core region 125, along with the subsequently deposited cladding layers, can be used to form a quantum well region. As should be understood by those of skill in the art, a quantum well is a potential well with only discrete energy values. The classic model used to demonstrate a quantum well is to confine particles, which were originally free to move in three dimensions, to two dimensions, by forcing them to occupy a planar region.

FIG. 3 further shows doping or ion implanting of the replacement fin structures 135, i.e., the core region 125, prior to the forming of cladding layers, to form a doped core region. In embodiments, the doping can be a heavy doping of the core region 125 with an n-type doping using various approaches. For example, the doping can be, e.g., ion implantation or in-situ doping of GaN material, i.e., the core region 125, during the growth of the core region 125. In embodiments, the doping can be performed with an n-type dopant at approximately an energy level of 15 meV with a dopant resistivity of about 0.002 Ωcm. More specifically, the doped core region is an n-type GaN material. As another example, Mg can be used for the n-type dopant using an energy level of 160 meV with a dopant resistivity of about 0.2-2 Ωcm. As another alterative, Zn can be used as the n-type doping, at an energy level of about 340 meV at a dopant resistivity of about 0.2-2 Ωcm.

Figure 4A:
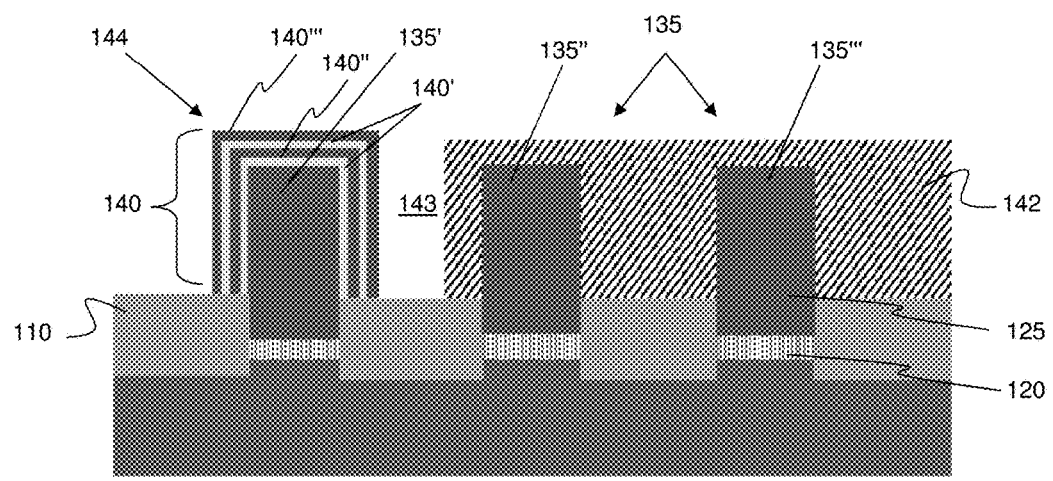
FIG. 4A shows a selective cladding of a fin structure, amongst other features, and respective fabrication processes in accordance with aspects of the present disclosure.

FIG. 4A shows the isolation region 110 recessed between the replacement fin structures 135, to a depth where minimal defects occur in the core region 125. In embodiments, the isolation regions 110 are recessed by a conventional RIE process, with selective chemistries, to below a surface of the core region 125. In other words, the recessed isolation region 110 will cover defects in the GaN material, e.g., core region 125, which are above the buffer layer 120.

FIG. 4A further shows the deposition of cladding layers on the core regions 125. A hardmask 142 is applied over select replacement fin structures 135 to protect the replacement fin structures 135", 135'" from being cladded with the cladding layers 140. The hardmask 142 can be any suitable hardmask material which protects the replacement fin structures 135", 135'" from being cladded. An opening 143 is formed in the hardmask 142 to expose the replacement fin structure 135' for cladding, and more particularly to expose the core region 125 of the replacement fin structure 135' for cladding with the cladding layers 140. By cladding the core region 125, a quantum well region 144, i.e., a first color emitting region, is formed, while the other replacement fin structures 135", 135'" remain protected, i.e., the core regions 125 of the replacement fin structures 135", 135'" remain protected. In this representation, the quantum well region 144 can be a blue region, as an example. After the quantum well region 144 is formed, the hardmask 142 can be removed by an oxygen ashing or other conventional stripant.

In FIG. 4A, several cladding layers 140 are used to form the multiple quantum well region 144. In embodiments, the quantum well region 144 is composed of the n-type doped core region 125, post doping processes, with the cladding layers 140 composed of alternating layers of InGaN and GaN materials as described herein. For example, the cladding layers 140 can be comprised of alternating layers of InGaN/GaN/InGaN/GaN materials, i.e., alternating InGaN and GaN materials. More specifically, an InGaN layer 140' is deposited on the core region 125, with a GaN layer 140" deposited on the InGaN layer 140', followed by another InGaN layer 140'. A GaN layer 140'" is deposited on the InGaN layer 140'. The GaN layer 140" can be n-type GaN; whereas the GaN layer 140'", i.e., the uppermost cladding layer, can be a p-type (p+) GaN layer, and can be formed over the other cladding layers 140, i.e., the InGaN layers 140' and GaN layer 140". The GaN layer 140'" can be used to form low resistive contacts in subsequent steps. In embodiments, the alternating layers of InGaN/GaN/InGaN/GaN of the cladding layers 140 can be deposited by a conventional CVD process.

In embodiments, the InGaN layers 140' form the quantum wells, which may or may not be doped. More specifically, the n-type doped core region 125 of the replacement fin structure 135' acts as a buffer region for the quantum well (InGaN layers) 140', whereas the p-type GaN layer 140'" acts as the cap region of the quantum well 140'. In further embodiments, this could be reversed, with n-type doped core region 125 as the cap region and the p-type GaN layer 140'" as the buffer region. In embodiments, the cladding layers 140, i.e., the layers InGaN/GaN/InGaN/GaN, can each have a thickness of about less than 10 nm, and preferably in a range of about 3 nm to 10 nm.

Figure 4B:
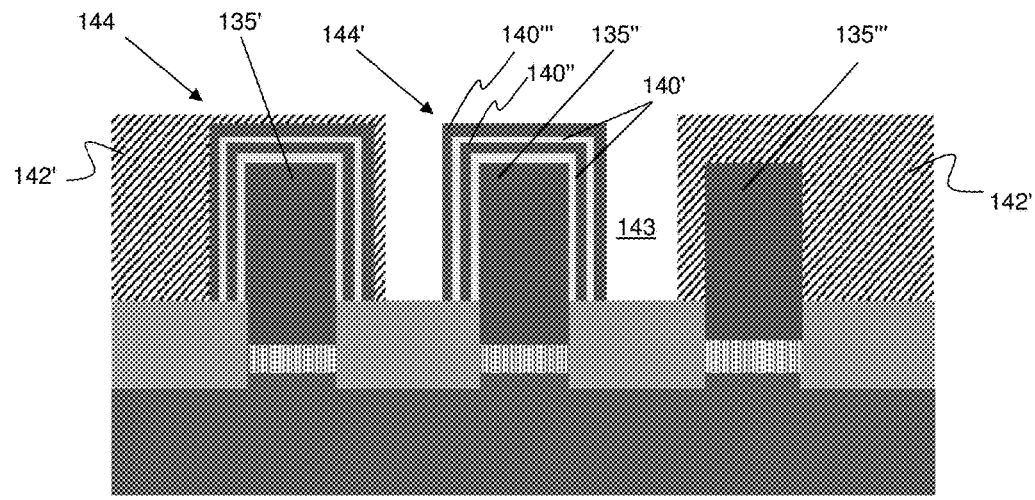
FIG. 4B shows a selective cladding of another fin structure, amongst other features, and respective fabrication processes in accordance with aspects of the present disclosure.

FIG. 4B shows the selective cladding of another replacement fin structure 135", while the quantum well region 144 and the remaining replacement fin structure 135'" and their respective core regions 125 are protected by another hardmask 142'. An opening 143 is formed in the hardmask 142' to expose the replacement fin structure 135" for cladding, and more particularly to expose the core region 125 of the replacement fin structure 135" for cladding. By depositing the cladding layers 140, i.e., InGaN layers 140', GaN layer 140" and the GaN layer 140'", and thereby cladding the core region 125 of the replacement fin structure 135", a second quantum well region 144' is formed. The second quantum well region 144' is a second color emitting region, and can emit a color different than the color emitted from the first color emitting region, i.e., the first quantum well region 144. The different cladding layers 140, i.e., InGaN layers 140', GaN layer 140" and GaN layer 140'", can be deposited in the manner as already described herein, e.g., CVD process.

Figure 4C:
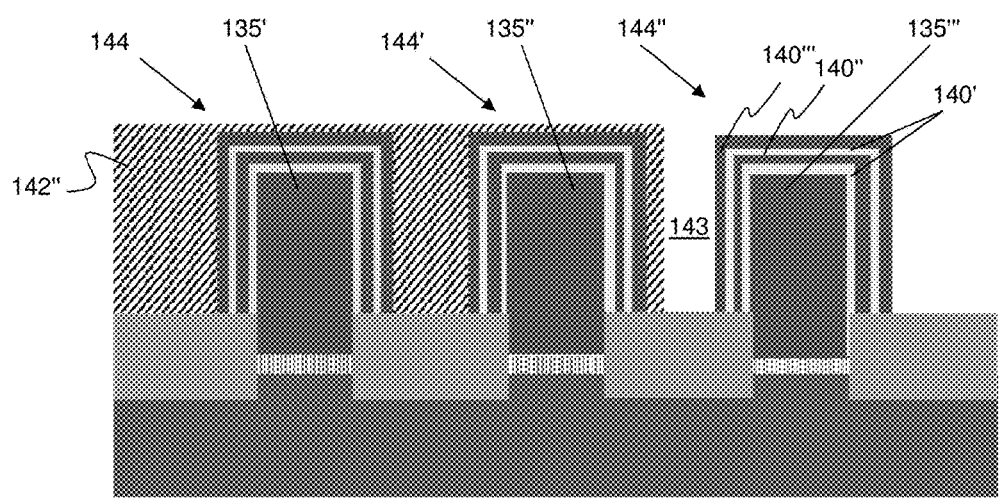
FIG. 4C shows a selective cladding of another fin structure, amongst other features, and respective fabrication processes in accordance with aspects of the present disclosure.

FIG. 4C shows the selective cladding of another replacement fin structure 135'", while the quantum well regions 144, 144' and their respective core regions 125 are protected by another hardmask 142". An opening 143 is formed in the hardmask 142" to expose the replacement fin structure 135'" for cladding, and more particularly to expose the core region 125 of the replacement fin structure 135'" for cladding. By depositing the cladding layers 140, i.e., InGaN layers 140', GaN layer 140" and GaN layer 140'", and thereby cladding the core region 125 of the replacement fin structure 135'", a third quantum well region 144" is formed. The different cladding layers 140, i.e., the InGaN layers 140', GaN layer 140" and the GaN layer 140'", can be deposited in the manner already described herein, e.g., CVD process.

The third quantum well region 144" is a third color emitting region, and can emit a color different than the colors emitted by the first and second color emitting regions, i.e., the first quantum well region 144 and the second quantum well region 144'. In this representation, the quantum well regions 144', 144" can be a green region and red region, respectively; whereas, the quantum well region 144 is a blue region. In embodiments, the different color emitting regions, i.e., the quantum well regions 144, 144', 144", have different bandgaps for different colors.

Particularly, the different colors are achieved by varying the percentage of indium (In) in the well layers, i.e., the InGaN layers 140', of the cladding layers 140, of the quantum well regions 144, 144', 144". More specifically, the % of In in the InGaN layers 140' of the quantum well regions 144, 144', 144", is varied to achieve different bandgaps for different color LEDs. For example, x defines the % (atomic percent) of In in the $In_xGa_{1-x}N$ well layer, i.e., the InGaN layers 140'. The percentages of In for the $In_xGa_{1-x}N$ layer in the quantum well regions 144, 144', 144" may be as follows: 1) Blue, x=15-20%; 2) Green, x=25-30%; and 3) Red, x=35-40%.

Other percentages of In may be useful, as long as the different bandgaps have sufficient separation. For example, different percentages of In results in different quantum well bandgaps, which emit different wavelengths of light, i.e., different colors. It should be understood by those of skill in the art that the quantum well regions 144, 144', 144" can be arranged differently, e.g., a blue region, a green region and a red region, respectively.

Figure 5:
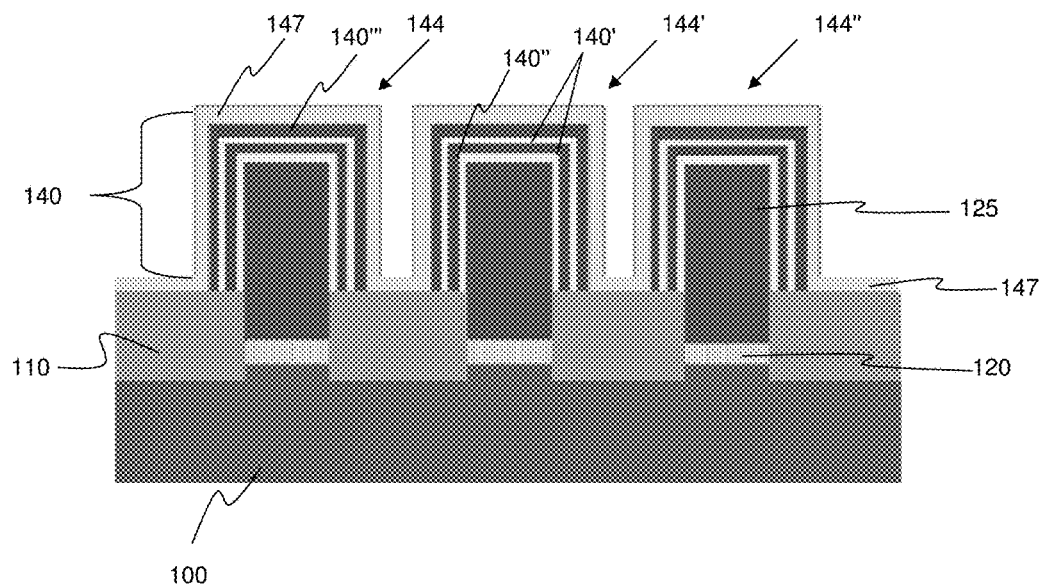
FIG. 5 shows cladded fin structures, amongst other features, and respective fabrication processes in accordance with aspects of the present disclosure.

FIG. 5 illustrates the quantum well regions 144, 144', 144" covered by an insulator layer 147 in accordance with aspects of the present disclosure. The insulator layer 147 can be conformally deposited on the GaN layer 140''', i.e., the uppermost p-type GaN layer. In embodiments, the insulator layer 147 is an insulating material such as SiN or SiO$_2$, as examples. Preferably, the insulator layer 147 is a material that is different than the material of the isolation region 110, e.g., SiO$_2$, so that subsequent etching process, e.g., selective removal of the isolation region 110, can be performed without an additional masking step. By insulating the quantum well regions 144, 144', 144", the insulator layer 147 insulates the first color emitting region, the second color emitting region and the third color emitting region.

Figure 6:
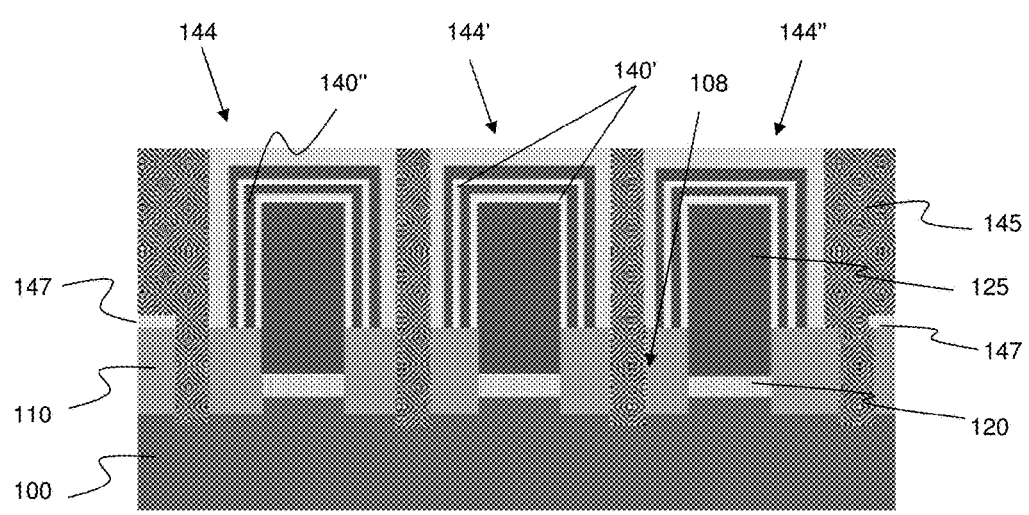
FIG. 6 shows contacts to the substrate, amongst other features, and respective fabrication processes in accordance with aspects of the present disclosure.

FIG. 6 shows a metal layer 145 formed in contact with the substrate 100. In embodiments, to deposit the metal layer 145, trenches or openings 108 are formed in the isolation regions 110 and the insulator layer 147 by a RIE process. The trenches 108 will expose portions of the substrate 100 for subsequent contact formation. The metal layer 145 is deposited in the trenches 108 and between the insulator layer 147 of the different replacement fin structures 135', 135", 135''', e.g., between the multiple quantum well regions 144, 144', 144". The metal layer 145 can be aluminum (Al), which serves as an ohmic contact to the substrate 100. Further, the metal layer 145 can be a reflective metal material. The metal layer 145 can be deposited by a CVD process, followed by a polishing CMP to be planar with the insulator layer 147 on the top surfaces of the quantum well regions 144, 144', 144".

Figure 7:
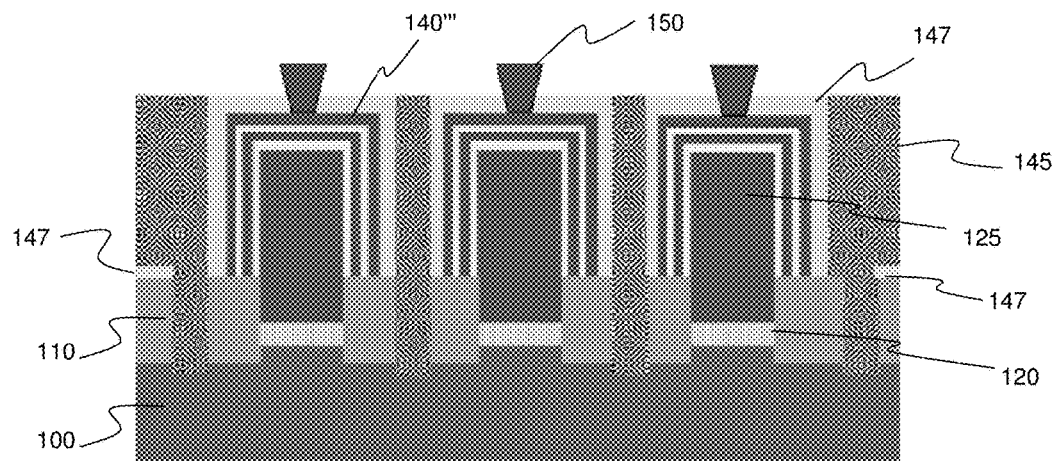
FIG. 7 shows contacts to the cladded fin structures, amongst other features, and respective fabrication processes in accordance with aspects of the present disclosure.

FIG. 7 shows contacts formed to the p-type GaN layer 140'''. In embodiments, the contacts 150 are preferably p-type contacts in contact with the p-type GaN layer 140''' and forming a p-junction to the p-type GaN layer 140'''. The contacts 150 can be, e.g., palladium (Pd), nickel (Ni) or gold (Au), as examples. In embodiments, the contacts 150 can be formed by conventional lithography, etching and deposition processes. For example, a resist formed over the insulator layer 147 is exposed to energy (light) to form an opening. An etching process, e.g., RIE, is performed through the opening, to form a via in the insulator layer 147, and to expose the GaN layer 140'''. A metal layer, which is used to form the contacts 150, is then deposited within the via, followed by a CMP process, if desired. The metal contacts 150 can be copper or aluminum, for example.

Figure 8:
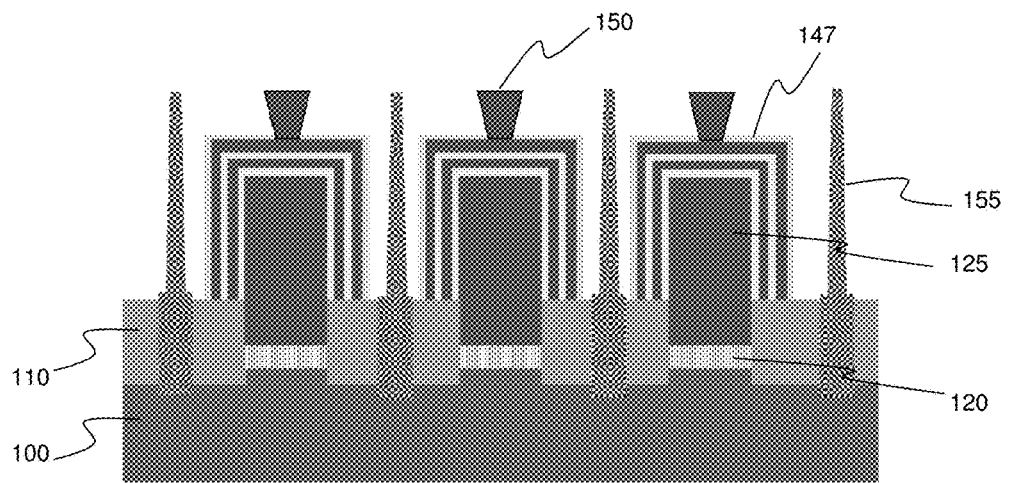
FIG. 8 shows mirrors, amongst other features, and respective fabrication processes in accordance with aspects of the present disclosure.

In FIG. 8, reflective mirrors 155 are formed by etching the metal layer 145. Particularly, the reflective mirrors 155 are comprised of a metal material of the metal layer 145, which also contacts to the substrate material 100. This provides an integrated reflector/reflective coating, and also acts as contacts for cathodes. The reflective mirrors 155 are formed between the insulator layer 147 of the different replacement fin structures 135', 135", 135''' e.g., between the multiple quantum well regions 144, 144', 144". Further, the reflective mirrors 155 contact the underlying substrate 100. As shown in FIG. 8, the reflective mirrors 155 are formed between adjacent cladded core regions, i.e., the quantum wells 144, 144', 144", as a contact to the substrate material 100.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming recessed fin structures with a doped core region thereon, from a substrate material;
   forming a first color emitting region by cladding the doped core region of a first recessed fin structure of the recessed fin structures, while protecting the doped core regions of a second recessed fin structure and a third recessed fin structure of the recessed fin structures;
   forming a second color emitting region by cladding the doped core region of the second recessed fin structure, while protecting the doped core regions of the first recessed fin structure and the third recessed fin structure; and
   forming a third color emitting region by cladding the doped core region of the third recessed fin structure, while protecting the doped core regions of the first recessed fin structure and the second recessed fin structure.

2. The method of claim 1, wherein the cladding the first recessed fin structure, the second recessed fin structure and the third recessed fin structure forms quantum wells.

3. The method of claim 2, wherein the cladding of each of the first recessed fin structure, the second recessed fin structure and the third recessed fin structure comprises depositing layers of alternating InGaN materials and GaN materials while protecting the recessed fin structures which are not being cladded with a hardmask.

4. The method of claim 3, further comprising forming a p-type GaN layer over the cladding layers and an insulator layer over the p-type GaN layer.

5. The method of claim 1, further comprising forming p-type contacts in contact with a p-type GaN layer.

6. The method of claim 5, further comprising forming a buffer layer configured between the doped core region of each recessed fin structure and the substrate material which is etched to form the recessed fin structures.

7. The method of claim 6, wherein the buffer layer is AlN.

8. The method of claim 1, further comprising doping the recessed fin structures, prior to cladding the first recessed fin structure, the second recessed fin structure and the third recessed fin structure.

9. The method of claim 1, further comprising forming an insulator layer after the cladding the first recessed fin structure, the second recessed fin structure and the third recessed fin structure, which insulates the first color emitting region, the second color emitting region and the third color emitting region.

10. The method of claim 9, further comprising forming isolation regions between each of the recessed fin structures, the isolation regions comprised of a material different than the insulator layer.

11. The method of claim 1, further comprising forming mirrors between adjacent ones of the recessed fin structures.

12. The method of claim 11, wherein the mirrors are comprised of a metal material which also contacts to the substrate material.

13. A method comprising:
forming fin structures of substrate material;
recessing the fin structures to form recessed fin structures;
forming doped core regions on the recessed fin structures by depositing core material on the recessed fin structures;
forming a hardmask over core regions which are not yet to be cladded, while leaving at least one core region exposed for cladding;
forming alternating cladding layers on the at least one exposed core region;
removing the hardmask;
forming another hardmask over the alternating cladding layers and at least one additional core region which is not yet to be cladded, while leaving at least another core region exposed for cladding; and
forming alternating cladding layers on the at least another exposed core region.

14. The method of claim 13, wherein the alternating cladding layers form a quantum well.

15. The method of claim 13, further comprising:
forming isolation regions between the core regions; and
etching trenches through the isolation regions which exposes the substrate material.

16. The method of claim 15, further comprising:
depositing a metal material within the trenches and on the exposed substrate material; and
forming mirrors from the metal material between adjacent cladded core regions, as a contact to the substrate material.

17. The method of claim 13, further comprising:
forming a buffer layer; and
forming the doped core regions over the buffer layer.

18. The method of claim 17, wherein the cladding comprises alternating InGaN and GaN materials, with an uppermost p-type GaN layer.

19. The method of claim 18, further comprising:
forming an insulator layer over the p-type GaN layer;
etching the insulator layer to expose a surface of the p-type GaN layer; and
forming contacts on the exposed surface of the p-type GaN layer.

20. A method, comprising:
forming doped core regions on recessed fin structures of a substrate material;
forming a first color emitting region by cladding a first doped recessed fin structure of the doped recessed fin structures, while protecting remaining doped recessed fin structures;
forming a second color emitting region by cladding a second doped recessed fin structure of the doped recessed fin structures, while protecting the first doped recessed fin structure and the remaining doped recessed fin structures; and
forming a third color emitting region by cladding a third doped recessed fin structure of the doped recessed fin structures, while protecting the first doped recessed fin structure, the second doped recessed fin structure and the remaining doped recessed fin structures.

* * * * *